United States Patent [19]

Herscher

[11] Patent Number: 4,876,654
[45] Date of Patent: Oct. 24, 1989

[54] TRUE RMS POWER DEMODULATION SYSTEM AND METHOD FOR A MODULATED RF SIGNAL

[75] Inventor: Bret A. Herscher, Mountain View, Calif.

[73] Assignee: Wavetek Microwave, Inc., Sunnyvale, Calif.

[21] Appl. No.: 176,717

[22] Filed: Apr. 1, 1988

[51] Int. Cl.⁴ .................. G01R 23/00; H03D 1/04
[52] U.S. Cl. ................ 364/483; 324/77 B; 364/484; 364/571.06; 364/572; 375/94
[58] Field of Search ........... 364/525, 571.01, 571.06, 364/487, 572, 570, 484, 573, 483; 375/10, 60, 94; 324/77 A, 77 B, 57 R, 77 F, 57 PS, 99 D

[56] References Cited

U.S. PATENT DOCUMENTS

| | | |
|---|---|---|
| 4,160,134 | 7/1979 | Carroll ..................... 324/99 D |
| 4,291,277 | 9/1981 | Davis et al. .................. 375/60 |
| 4,453,257 | 6/1984 | Lo et al. ..................... 375/60 |
| 4,568,878 | 2/1986 | Bales ....................... 324/77 B |
| 4,679,162 | 7/1987 | Ferber et al. ............ 364/571.06 |
| 4,720,673 | 1/1988 | Hatfield .................... 324/77 B |
| 4,758,783 | 7/1988 | Danzeisen ................. 324/77 B |
| 4,785,419 | 11/1988 | Huffman ................. 364/571.01 |

Primary Examiner—Parshotam S. Lall
Assistant Examiner—Kevin J. Teska
Attorney, Agent, or Firm—Donald J. Lisa

[57] ABSTRACT

True RMS power demodulation system and method for a modulated RF signal uses a DC coupled linear amplifier and linearizes the diode detector prior to demodulation. The demodulated signal is proportional to the difference of RF powers such that the network measurement is unaffected by the modulation depth at the power sensor which can be degraded by RF feed-through or the presence of an interfering signal or noise.

26 Claims, 3 Drawing Sheets

TRUE RMS POWER DEMODULATION SYSTEM AND METHOD FOR A MODULATED RF SIGNAL

BACKGROUND OF THE INVENTION

The present invention relates, in general, to the field of true RMS power demodulation systems and methods for a modulated RF signal. More particularly, the present invention relates to scalar network analyzers and systems and methods for power demodulation of a modulated RF signal for deriving true RMS power and eliminating the errors inherent in conventional equipment.

Certain microwave measurements require a modulation to be placed on the stimulus signal in order to permit the receiver to distinguish the desired signal from any unmodulated interfering signal which may leak into the test system. Typical measurements requiring such a tag to be placed on the desired signal are mixer or antenna measurements. True RMS measurements are especially critical when the signals have significant amounts of harmonics or modulation. This is often the case when measuring active devices running into compression.

Typical systems use a microwave detector and then use the difference between the detected voltage when the modulation is on and the detector voltage when the modulation is off to calculate the appropriate power measurement. Such a technique provides good rejection of the interfering signal in the sense that the detector reads zero when there is no modulated signal, however, the linearity of the detector is severely affected by the presence of the unmodulated signal.

These prior art techniques AC couple the output of the detector to remove the unmodulated portion incident upon the detector. Such a technique works satisfactorily given a linear detector, however diode detectors are inherently non-linear devices and most be corrected for their non-linearity. Conventional correction techniques lead to errors in measurement of the modulated RF power as amplitude of the interfering signal grows.

It would thus be highly desirable to provide a true RMS power demodulation system and method to eliminate the errors which are present in conventional equipment. It would further be highly desirable to provide a true RMS power demodulation system and method for a modulated RF signal which may be used in a scalar analyzer and which offers significantly improved accuracy over conventional scalar analyzers in AC detection modes, especially in the presence of interfering signals.

SUMMARY OF THE INVENTION

It is therefore an object of the present invention to provide an improved true RMS power demodulation system and method for a modulated RF signal.

It is further an object of the present invention to provide an improved true RMS power demodulation system and method for a modulated RF signal which is simply implemented and results in no signal distortion which might interfere with subsequent measurements.

It is still further an object of the present invention to provide an improved RMS power demodulation system and method for a modulated RF signal for use in the front end of a scalar network analyzer and which offers significantly improved accuracy over conventional techniques in the presence of interfering signals.

It is still further an object of the present invention to provide an improved true RMS power demodulation system and method for a modulated RF signal which eliminates the disadvantages inherent in conventional AC coupled demodulation techniques and which is not susceptible to errors otherwise leading to degradation in accuracy in the presence of interfering signals.

The foregoing and other features and objects of the present invention are achieved wherein there is provided a system and method for true RMS power demodulation of an input signal comprising the steps of detecting the input signal to provide a detected signal and converting the detected signal to power to provide a converted signal. The converted signal is demodulated to provide the demodulated signal.

In a more particular embodiment of the present invention there is provided a system and method for true RMS power demodulation of a modulated RF signal which comprises the steps of enabling a modulator to provide a modulated RF signal to a detector and detecting the modulated RF signal to provide a modulated detected signal. The modulated detected signal is linearly amplified to provide a modulated amplified signal and a voltage level of the modulated amplified signal is measured to establish $V_{on}$. The modulator is then disabled to provide an unmodulated RF signal to the detector which, in turn, provides an unmodulated detected signal. The unmodulated detected signal is linearly amplified to provide an unmodulated amplified signal and the voltage level measured to establish $V_{off}$. Power levels $P_{on}$ and $P_{off}$ are calculated respectively for the amplified signals $V_{on}$ and $V_{off}$. True RMS power of the modulated RF signal is determined by subtracting $P_{off}$ from $P_{on}$.

BRIEF DESCRIPTION OF THE DRAWINGS

The above mentioned, and other features and objects of the present invention and the manner of attaining them will become more apparent and the invention will be best understood by reference to the following description of an embodiment of the invention taken in conjunction with the accompanying drawings wherein.

DESCRIPTION OF A PREFERRED EMBODIMENT

Figure 1A:
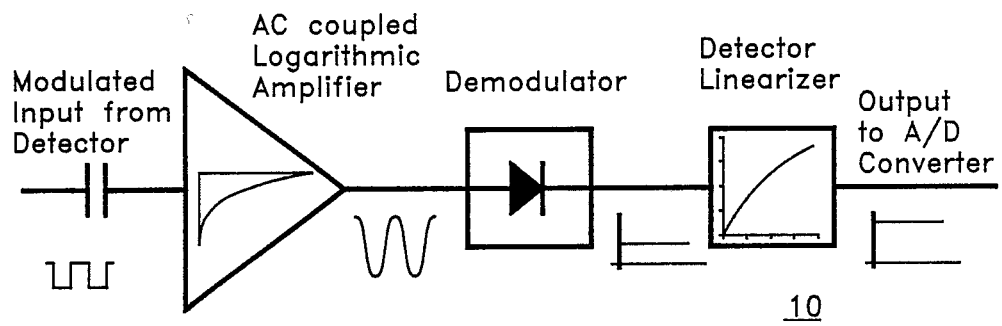
FIG. 1a is a simplified illustration of a prior art AC coupled demodulation circuit for use in a conventional scalar network analyzer front end.

With reference to FIG. 1a, a prior art demodulation circuit 10 is shown as used as the front end amplifier in a conventional scalar analyzer. AC detection has been used in scalar analysis systems in order to reject signals in the microwave system which can interfere with the measurements. However, traditional scalar network analyzers use AC coupled logarithmic amplifiers which limit the accuracy with which these signals can be rejected because knowledge of the DC operating point of the diode detector is lost. Such conventional scalars demodulate the detected voltage as shown in the accompanying waveforms and this can lead to unnecessary large measurement errors as the level of the interfering signals increases. The AC coupled logarithmic amplifiers used in prior art demodulation circuit 10 have traditional dynamic range and linearity limitations.

Figure 1B:
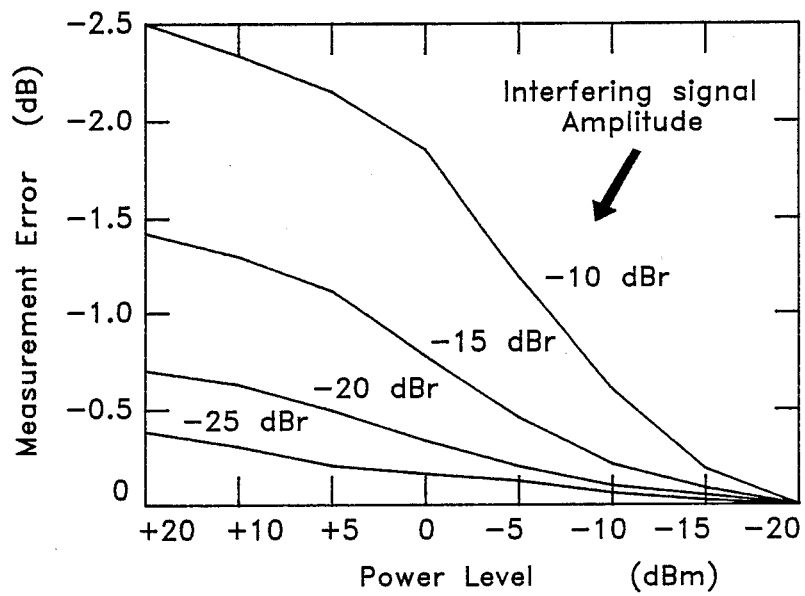
FIG. 1b illustrates the progressively larger measurement errors encountered as the effective RF modulation depth is decreased in the utilization of the prior art AC coupled demodulation circuit of FIG. 1a when used in the front end of a scalar network analyzer.

Referring additionally now to FIG. 1b, a plot of measurement error (dB) versus power level (dBm) illustrates the errors which can result from an AC coupled system, as shown in FIG. 1a, as the effective modulation depth degenerates. The errors result from the fact that under these circumstances, the diode detector can be operating in its peak detecting region but the difference voltage generated is misinterpreted as a square law signal. This situation is further compounded by the fact that most scalar measurements involve normalization and/or ratioing at a power level different from that at which the measurement is made. Therefore, because the DC information is lost in each case in an AC coupled system, there is no possibility of compensating for any of these errors thereafter.

Figure 2:
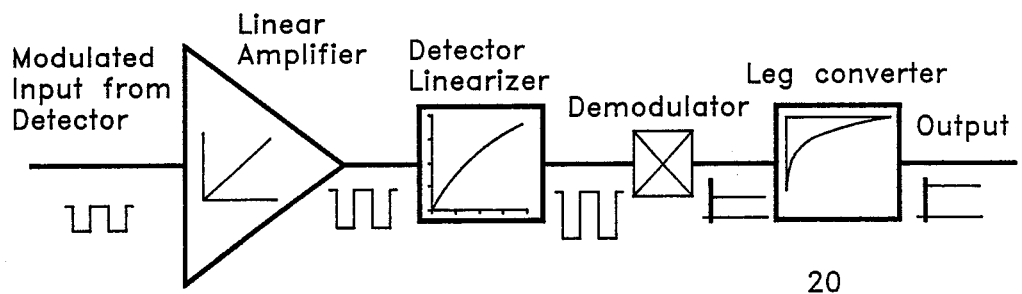
FIG. 2 is a simplified illustration of the true RMS power demodulation system and method of the present invention for use, for example, in a scalar network analyzer.

Referring now to FIG. 2, a true RMS power demodulation circuit 20 is shown. True RMS power demodulation circuit 20 uses a DC coupled linear amplifier and linearizes the diode detector prior to demodulation. As a result, the demodulated signal is proportional to the difference of RF powers. This means that the network measurement is uneffected by the modulation depth at the power sensor which can be degraded by RF feedthrough or the presence of an interfering signal or noise.

Figure 3:
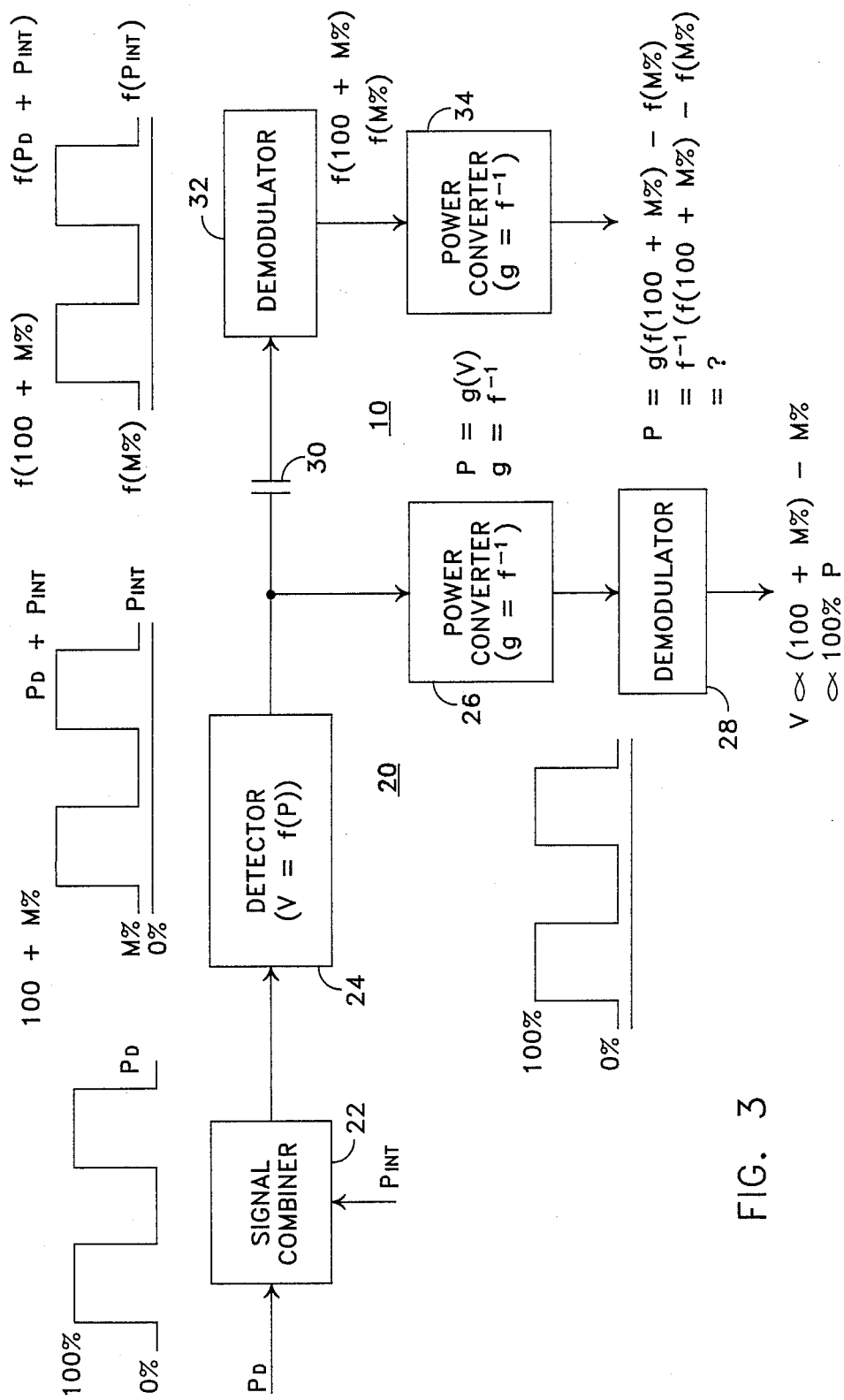
FIG. 3 is a partial block diagram of the system of the present invention shown in FIG. 2 in conjunction with the prior art system of FIG. 1a for further comparison purposes.

Referring additionally now to FIG. 3, a comparison of the operation of true RMS power demodulation circuit 20 of the present invention and prior art demodulation circuit 10 is shown. An input signal $P_d$ is shown as input to signal combiner 22 along with an interfering signal $P_{int}$. Input signal $P_d$ is modulated to "tag" it so that it can be identified and discriminated from the interfering signal $P_{int}$. As shown, input signal $P_d$ may be modulated from zero to 100%. At the output of signal combiner, the waveform of the combined signals $P_d$ and $P_{int}$ is substantially as illustrated. That is, the input signal is now modulated from M% (due to $P_{int}$) to (100+M%) or, viewed another way, from a level of $P_{int}$ to ($P_d + P_{int}$) The signal in substantially this form is applied to detector 24.

Detector 24 which is a non-linear device such as a diode has a function substantially equal to $V = f(P)$. Therefore, the signal leaving detector 24 may be thought of as modulated between f(M%) to f(100+M%). Prior art demodulation circuit 10 would then utilize an AC coupling device such as a capacitor 30 to remove the unmodulated portion of the signal and apply it to demodulator 32. The output of demodulator 32 would then be a function of f(100+M%)−f(M%). Applying this signal, in turn, to power convertor 34 which has a function equal to $P = g(V)$, results in a power output signal which is a function g(f(100+M%)−f(M%)). From this equation it can be seen that the true RMS power of the modulated signal cannot be determined because only the difference of the two signals is known since the AC coupling removes the DC component of the detected signal.

Applying the output of detector 24 to power convertor 26 provides at its output a signal modulated again from M% to (100+M%), which signal, demodulated through demodulator 28, provides a voltage proportional to (100+M%−M%) or 100% P of the applied input signal. Therefore, while prior art demodulation circuit 10 is susceptible to error, which, in typical measurements can lead to a degradation in accuracy of as much as +/− 3dB (+150% to −50%). True RMS power demodulation circuit 20 has no such error.

Figure 4:
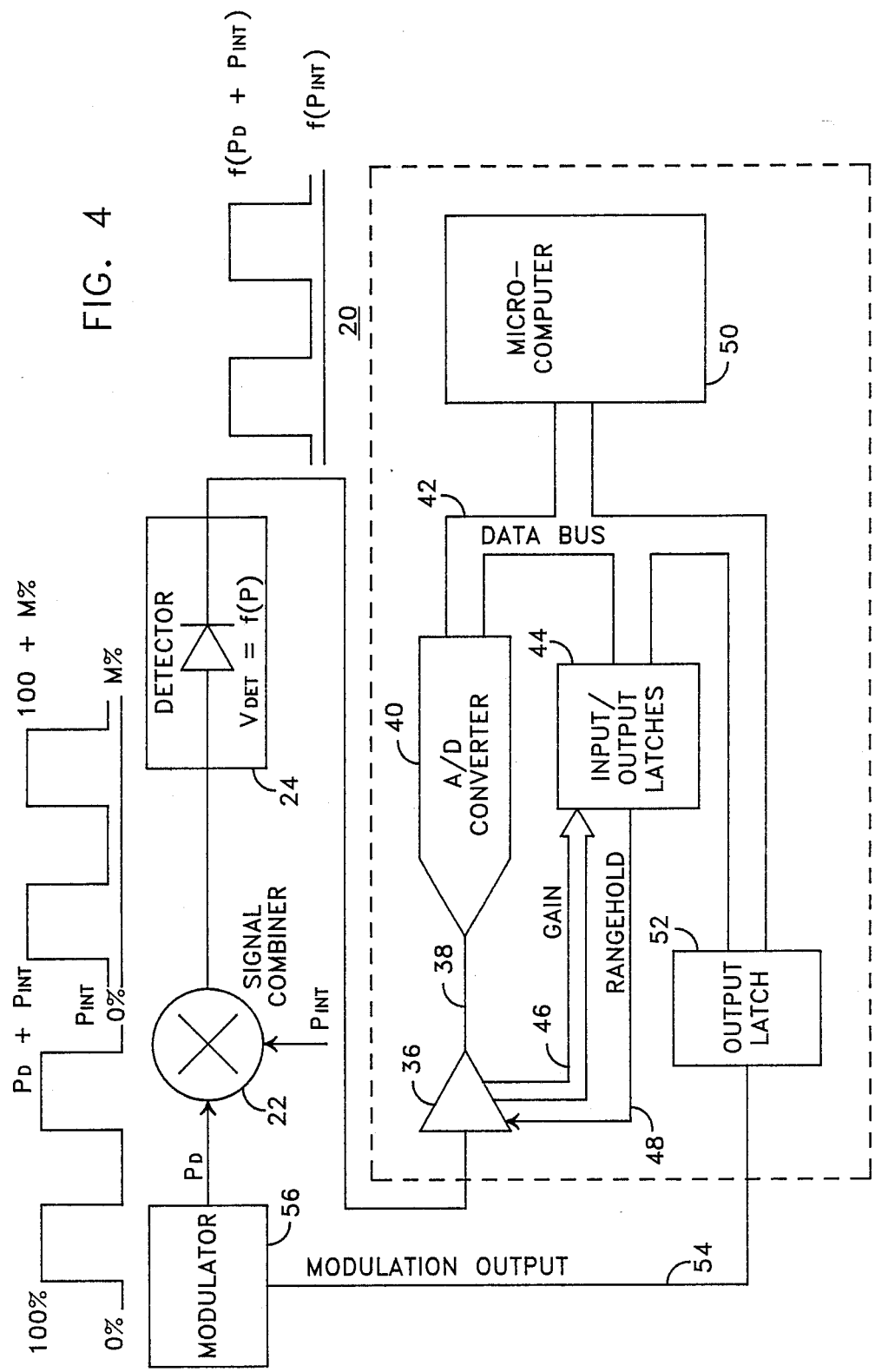
FIG. 4 is a functional block diagram of a possible implementation of the system and method of the present invention; and, FIG. 5 is a logic flow chart illustrating the functional aspects of the embodiment of FIG. 4.

Referring now to FIG. 4, a specific embodiment of true RMS power demodulation circuit 20 is shown. In this embodiment, an input signal $P_d$ is combined with an interfering signal $P_{int}$ through signal combiner 22 as previously described. The output of signal combiner 22 is detected by means of detector 24 and applied as input to linear amplifier 36. The output of linear amplifier 36 appearing on output line 38 is supplied as analog input to A to D convertor 40 for supplying a digital representation of the analog signal on output line 38 to data bus 42. Data bus 42 couples microcomputer 50 to A to D convertor 40, input/output latches 44 and output latch 52. Input/output latches 44 receive a gain control signal from linear amplifier 36 on gain control line 46. Input/output latches 44, in turn, supply a rangehold signal appearing on rangehold signal line 48 to linear amplifier 36. As shown, output latch 52 supplies a modulation control signal on modulation output line 54 to modulator 56 for modulating input signal $P_d$.

Figure 5:
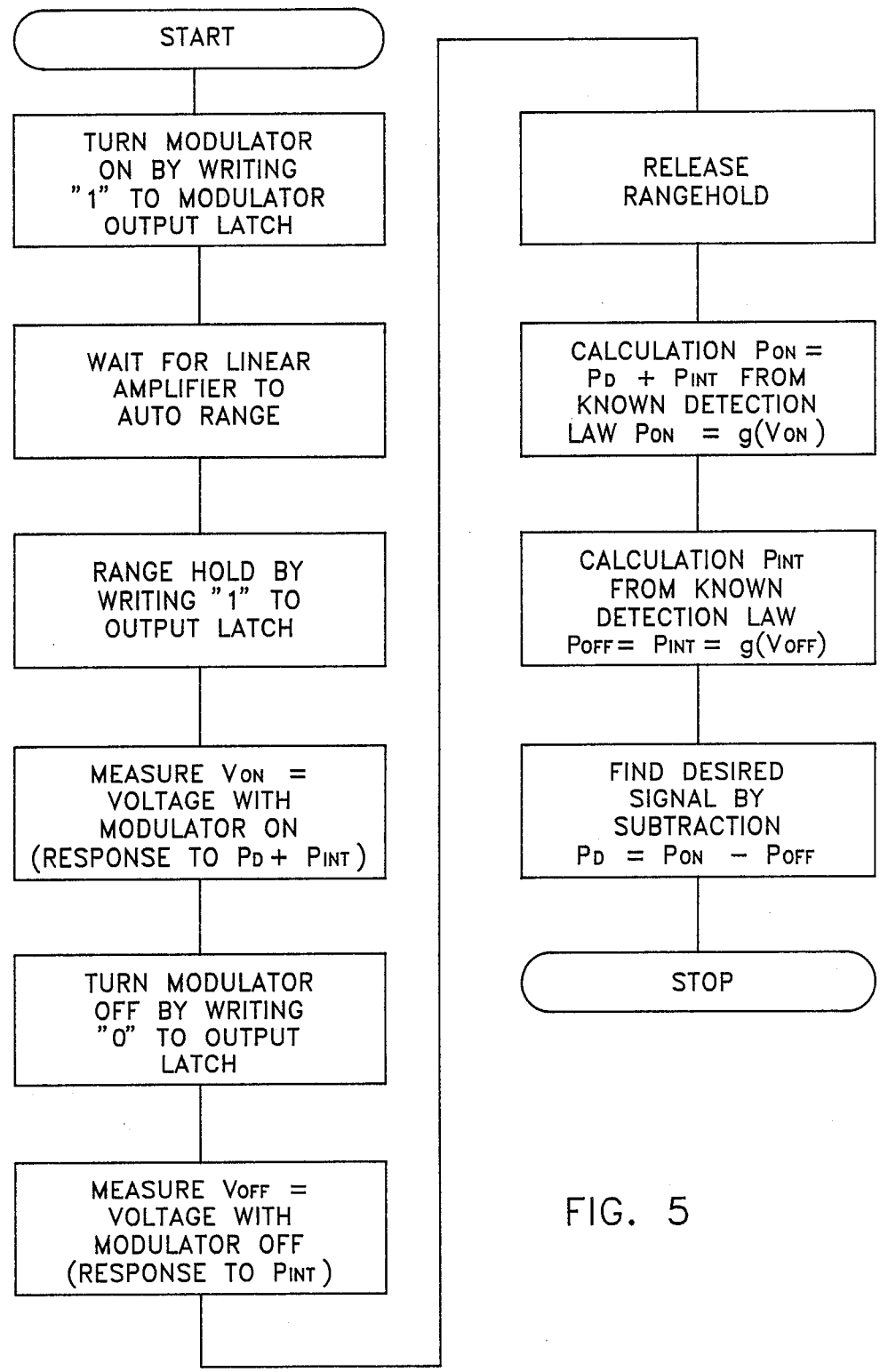

Referring additionally to FIG. 5, a logic flow diagram representative of the operation of true RMS power demodulation circuit 20 of FIG. 4 is shown. In operation, modulator 56 is turned on by writing a logical "1" to modulator output latch 52. Upon detection of an auto-ranging of linear amplifier 36, a rangehold signal from input/output latches 44 is supplied on rangehold signal line to linear amplifier 36. At this point, $V_{on}$ is measured by means of A to D convertor 40 and is digitally applied to data bus 42.

At this point, modulator 56 is turned off by writing a logical "0" to output latch 52 for providing a disable signal on modulation output line 54. In the same manner, $V_{off}$ is measured by means of A to D convertor 40 to find the response of the system to $P_{int}$. Rangehold to linear amplifier 36 is released and microcomputer 50 is able to calculate $P_{on}$ as equal to $P_d + P_{int}$ using the known detection law of detector 24 as $P_{on} = g(V_{on})$. True RMS power demodulation circuit 20 can then calculate $P_{int}$ from the known detection law of detector 24 as being $P_{off} P_{int}$ g($V_{off}$). Having determined $P_{on}$ and $P_{int}$, the desired signal can be established as $P_d = P_{on} - P_{off}$. It should be noted that true RMS power demodulation circuit 20 need not control modulator 56 as shown to function in accordance with the technique disclosed but rather it may sense the modulated and unmodulated states of an asynchronous signal and measure $V_{on}$ and $V_{off}$ accordingly.

As can be seen, true RMS power demodulation circuit 20 eliminates the errors which are present in prior art equipment. In essence, the system calculates the level of the unmodulated power by making a simple CW power measurement when the modulation is off. It calculates the apparent sum of powers by making a CW power measurement when the modulation is on. The difference [(modulated signal+ interfering)−(interfering)] gives the apparent power of the modulated signal.

What has been provided therefore, is an improved true RMS power demodulation system and method for a modulated RF signal which is simply implemented and results in no signal distortion which might interfere with subsequent measurements. The system and method of the present invention is of especial utility in the front end of a scalar analyzer and offers significantly improved accuracy over conventional techniques in the presence of interfering signals. The improved true RMS power demodulation system and method of the present invention eliminates the disadvantages inherent in conventional AC coupled demodulation techniques and is not susceptible to errors otherwise leading to degradation in accuracy in the presence of interfering signals.

While there have been described above the principles of the present invention in conjunction with specific apparatus and circuitry, it is to be clearly understood that the foregoing description is made only by way of example and not as a limitation to the scope of the invention.

What is claimed is:

1. A method for true RMS power demodulation of an input signal comprising the steps of:
   detecting said input signal to provide a detected signal;
   linearly amplifying said detected signal to produce an amplified signal;
   linearizing said amplified signal to provide a converted signal; and,
   demodulating said converted signal to provide a demodulated signal.

2. The method of claim 1 wherein said step of detecting is carried out by means of a non-linear detector.

3. The method of claim 1 further comprising the steps of:
   logarithmically converting said demodulated signal to provide an output signal.

4. A method for true RMS power demodulation of a modulation RF signal comprising the steps of:
   enabling a modulator to provide said modulated RF signal to a detector;
   detecting said modulated RF signal to provide a modulated detected signal;
   linearly amplifying said modulated detected signal to provide a modulated amplified signal;
   measuring a voltage level of said modulated amplified signal to establish $V_{on}$;
   disabling said modulator to provide an unmodulated RF signal to said detector;
   detecting said unmodulated RF signal to provide an unmodulated detected signal;
   linearly amplifying said unmodulated detected signal to provide an unmodulated amplified signal;
   measuring a voltage level of said unmodulated amplified signal to establish $v_{off}$;
   calculating a power level $P_{on}$ and $P_{off}$ respectively for said amplified signals $V_{on}$ and $v_{off}$; and, determining true RMS power of said modulated RF signal by subtracting $P_{off}$ from $P_{on}$.

5. The method of claim 4 wherein said steps of enabling and disabling are carried out by means of a microcomputer controlled output latch.

6. The method of claim 4 wherein said steps of detecting are carried out by means of a non-linear detector.

7. The method of claim 4 wherein said steps of measuring are carried out by means of an A to D converter.

8. The method of claim 4 wherein said step of calculating and determining are carried out by means of a microcomputer.

9. A system for true RMS power demodulation of an input signal comprising:
   means for detecting said input signal to provide a detected signal;
   linear amplifying means for producing an amplified signal from said detected signal;
   linearizing means to provide a converted signal from said amplified signal; and,
   means for demodulating said converted signal to provide a demodulated signal.

10. The system of claim 9 wherein said detecting means comprises a diode.

11. The system of claim 9 further comprising:
    logarithmic converting means for providing an output signal from said demodulated signal.

12. A system for true RMS power demodulation of a modulated RF signal comprising:
    means for enabling and disabling a modulator to provide a modulated and unmodulated input signals respectively;
    means for detecting said modulated and unmodulated input signals to provide first and second detected signals respectively;
    means for amplifying said first and second detected signals to provide first and second amplified signals respectively;
    means for measuring a voltage level of said first and second amplified signals;
    means for calculating a power level $P_{on}$ and $P_{off}$ for said first and second amplified signals respectively; and,
    means for determining true RMS power of said input signal by subtracting $P_{off}$ from $P_{on}$.

13. The system of claim 12 wherein said means for enabling and disabling comprise a microcomputer controlled output latch.

14. The system of claim 12 wherein said means for detecting comprises a diode.

15. The system of claim 12 wherein said means for amplifying comprises a linear amplifier.

16. The system of claim 12 wherein said means for measuring comprises an A to D convertor.

17. The system of claim 12 wherein said calculating and determining means comprise a microcomputer.

18. A method for true RMS power demodulation of a modulated RF signal comprising the steps of:
    providing an asynchronously modulated RF signal to a detector;
    detecting when said asynchronously modulated RF signal is modulated to provide a modulated detected signal;
    linearly amplifying said modulated detected signal to provide a modulated amplified signal;
    measuring a voltage level of said modulated amplifed signal to establish $V_{on}$;
    detecting when said asynchronously unmodulated RF signal is unmodulated to provide an unmodulated detected signal:
    linearly amplifying said unmodulated detected signal to provide an unmodulated amplified signal;

measuring a voltage level of said unmodulated amplified signal to establish $V_{off}$;

calculating a power level $P_{on}$ and $P_{off}$ respectively for said amplified signals $V_{on}$ and $V_{off}$; and, determining true RMS power of said modulated RF signal by subtracting $P_{off}$ from $P_{on}$.

19. The method of claim 18 wherein said steps of detecting are carried out by means of a non-linear detector.

20. The method of claim 18 wherein said steps of measuring are carried out by means of an A to D convertor.

21. The method of claim 18 wherein said steps of calculating and determining are carried out by means of a microcomputer.

22. A system for true RMS power demodulation of an asynchronously modulated RF signal comprising:

means for sensing a modulated and unmodulated portions of said RF signal to provide modulated and unmodulated input signals respectively;

means for detecting said modulated and unmodulated input signals to provide first and second detected signals respectively;

means for amplifying said first and second detected signals to provide first and second amplified signals respectively;

means for measuring a voltage level of said first and second amplified signals;

means for calculating a power level $P_{on}$ and $P_{off}$ for said first and second amplified signals respectively; and, means for determining true RMS power of said input signal by subtracting $P_{off}$ from $P_{on}$.

23. The system of claim 22 wherein said means for detecting comprises a diode.

24. The system of claim 22 wherein said means for amplifying comprises a linear amplifier.

25. The system of 22 claim wherein said means for measuring comprises an A to D convertor.

26. The system of claim 22 wherein said calculating and determining means comprise a microcomputer.

* * * * *